(12) United States Patent
Nelson et al.

(10) Patent No.: US 11,102,902 B2
(45) Date of Patent: Aug. 24, 2021

(54) DATA STORAGE SYSTEM CONNECTORS WITH PARALLEL ARRAY OF DENSE MEMORY CARDS AND HIGH AIRFLOW

(71) Applicant: Intel Corporation, Santa Clara, CA (US)

(72) Inventors: Michael D. Nelson, Mountain View, CA (US); Jawad B. Khan, Portland, OR (US); Randall K. Webb, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/932,635

(22) Filed: Jul. 17, 2020

(65) Prior Publication Data

US 2021/0007235 A1 Jan. 7, 2021

Related U.S. Application Data

(63) Continuation of application No. 16/083,411, filed as application No. PCT/US2016/022295 on Mar. 14, 2016, now Pat. No. 10,721,832.

(51) Int. Cl.
*H05K 7/20* (2006.01)
*H05K 7/14* (2006.01)
(Continued)

(52) U.S. Cl.
CPC ........... *H05K 7/1424* (2013.01); *G06F 1/183* (2013.01); *G06F 1/187* (2013.01); *G06F 1/20* (2013.01);
(Continued)

(58) Field of Classification Search
CPC .......... G06F 1/181; G06F 1/183; G06F 1/187; G06F 2212/261; G06F 2212/214;
(Continued)

(56) References Cited

U.S. PATENT DOCUMENTS 5,751,559 A   5/1998  Jensen et al.
6,833,995 B1 * 12/2004  Hsue .......................... G06F 1/20
                                                            211/184

(Continued)

OTHER PUBLICATIONS

Extended European Search Report for Patent Application No. 16894730.7, dated Oct. 11, 2019, 8 pages.

(Continued)

*Primary Examiner* — Anthony Q Edwards
(74) *Attorney, Agent, or Firm* — Compass IP Law, PC

(57) ABSTRACT

Data storage system connectors are described for a parallel array of dense memory cards that allow high airflow. In one example, a connector has a horizontal plane board having a plurality of memory connectors aligned in a row and a plurality of external interfaces, a plurality of memory cards, each having an edge connector at one end of the memory card to connect to a respective memory connector of the board, each memory card extending horizontally parallel to each other memory card and extending vertically and orthogonally from the board, and a plurality of interface connectors each to connect an edge connector to a respective board connector, the interface connectors extending horizontally from the one end of the memory cards and vertically to the respective plane board connector.

21 Claims, 13 Drawing Sheets

(51) Int. Cl.
*G06F 1/20* (2006.01)
*G06F 1/18* (2006.01)
*H01R 12/72* (2011.01)

(52) U.S. Cl.
CPC ......... *H05K 7/1445* (2013.01); *H05K 7/1487* (2013.01); *H05K 7/1488* (2013.01); *H05K 7/20727* (2013.01); *H05K 7/20836* (2013.01); *H01R 12/721* (2013.01)

(58) Field of Classification Search
CPC .. H05K 7/1424; H05K 7/1445; H05K 7/1487; H05K 7/1488
See application file for complete search history.

(56) References Cited

U.S. PATENT DOCUMENTS

| | | | | |
|---|---|---|---|---|
| 9,743,547 | B1* | 8/2017 | Amin-Shahidi | ..... G11B 33/128 |
| 10,721,832 | B2* | 7/2020 | Nelson | ................. H05K 7/1424 |
| 2005/0042893 | A1 | 2/2005 | Debord et al. | |
| 2006/0014433 | A1 | 1/2006 | Consoli et al. | |
| 2006/0276081 | A1 | 12/2006 | Cohen et al. | |
| 2010/0073861 | A1 | 3/2010 | Takeguchi et al. | |
| 2010/0122792 | A1 | 5/2010 | Shabbir et al. | |
| 2010/0217909 | A1 | 8/2010 | Pavol et al. | |
| 2013/0003285 | A1* | 1/2013 | Liang | ..................... G06F 1/185 |
| | | | | 361/679.31 |
| 2014/0268536 | A1 | 9/2014 | Herman et al. | |
| 2015/0245533 | A1 | 8/2015 | Wright et al. | |
| 2015/0277512 | A1 | 10/2015 | Davis et al. | |
| 2016/0306569 | A1 | 10/2016 | Yanagida et al. | |
| 2017/0262029 | A1 | 9/2017 | Nelson et al. | |
| 2017/0269871 | A1* | 9/2017 | Khan | ..................... G06F 3/0673 |
| 2019/0272008 | A1* | 9/2019 | Ping | ........................ G06F 1/187 |

OTHER PUBLICATIONS

First Office Action for U.S. Appl. No. 16/083,411, dated Jul. 26, 2019, 28 pages.
International Preliminary Report on Patentability for PCT Patent Application No. PCT/US16/22295, dated Sep. 27, 2018, 10 pages.
International Search Report and Written Opinion for PCT Patent Application No. PCT/US2016/022295, dated Nov. 30, 2016, 15 pages.
Notice of Allowance for U.S. Appl. No. 16/083,411, dated Mar. 11, 2020, 9 pages.

* cited by examiner

DATA STORAGE SYSTEM CONNECTORS WITH PARALLEL ARRAY OF DENSE MEMORY CARDS AND HIGH AIRFLOW

CLAIM OF PRIORITY

This application is a Continuation of, and claims the benefit of priority of, U.S. application Ser. No. 16/083,411 filed Sep. 7, 2018 entitled "DATA STORAGE SYSTEM CONNECTORS WITH PARALLEL ARRAY OF DENSE MEMORY CARDS AND HIGH AIRFLOW", which in turn claims priority to U.S. National Phase application under 35 U.S.C. § 371 of International Application No. PCT/US16/22295 filed Mar. 14, 2016, entitled "DATA STORAGE SYSTEM CONNECTORS WITH PARALLEL ARRAY OF DENSE MEMORY CARDS AND HIGH AIRFLOW" the entire contents of which are incorporated herein by reference.

FIELD

The present description pertains to the field of data storage systems, and in particular to a system with an array of memory cards.

BACKGROUND

High capacity, high speed, and low power memory is in demand for many different high powered computing systems, such as servers, entertainment distribution head ends for music and video distribution and broadcast, and super computers for scientific, prediction, and modeling systems. The leading approach to provide this memory is to mount a large number of spinning disk hard drives in a rack mounted chassis. The chassis has a backplane to connect to each hard drive and to connect the hard drives to other rack mounted chassis for computation or communication. The hard disk drives connect using SAS (Serial Attached SCSI (Small Computer System Interface)), SATA (Serial Advanced Technology Attachment), or PCIe (Peripheral Component Interface express) or other storage interfaces.

While the spinning disk hard drive provides a large amount of storage at low cost, it has a high power consumption, reliability issues and high heat production. This is not significant for desktop computers with a single drive but when hundreds or thousands of drives are combined, then the power required to drive and cool the disks can be significant. NAND flash drive prices are coming down steadily while reliability and longevity is being improved. As a result, for many applications an AFA (All Flash Array) is used for either hot, warm or cold storage applications or all.

Flash arrays are constructed at high volume in a 2.5" hard disk drive form factor and in a M.2 module form factor. These form factors have been specifically developed for notebook computers and provide an amount of storage, speed, power consumption and cost that is best suited for notebook computers. An AFA could be built using these standard form factor SSDs (Solid State Drives). When off the shelf 2.5" SSDs are used for a large capacity solution and they are vertically mounted there is a minimum rack-mount chassis size of 2 U or 3 U due to the size of the drives, the mounting connectors and the need for airflow. M.2 SSDs have a lower capacity and so require many more devices and connectors.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A memory system is described that provides a new connector for dense memory system designs, such as All Flash Array (AFA) designs, and other non-volatile or volatile high density memory systems. The system offers front serviceability of the storage modules, as well as excellent airflow characteristics. Instead of using M.2 form factor or 2.5" form factor SSDs that require a top serviceable model for a very dense solution. The system described herein has front or top serviceability of the array of flash storage modules, as well as excellent airflow characteristics. The front serviceable storage modules avoid the need for the chassis to slide out of the rack because there is no need to open the top cover to service the storage modules. Yet the system may still be mounted to a sliding carrier to allow for other modules to be serviced without removing the chassis, such as fans, interconnects, controllers, switches, and computing modules. The front access to the storage modules reduces cost, time, and risk when storage modules are replaced or reconfigured.

As described dense memory storage boxes have high airflow, heat dissipation and storage density using a thin and long SSD form factor. This SSD will be referred to herein as a "Ruler Storage Module", "RSM" or "ruler". Several RSMs may be used in a 19" wide rack-mount SSD system. They may be placed in a single row multiple column arrangement, which helps guide the airflow and provides maximum surface area for the NAND media.

Figure 1:
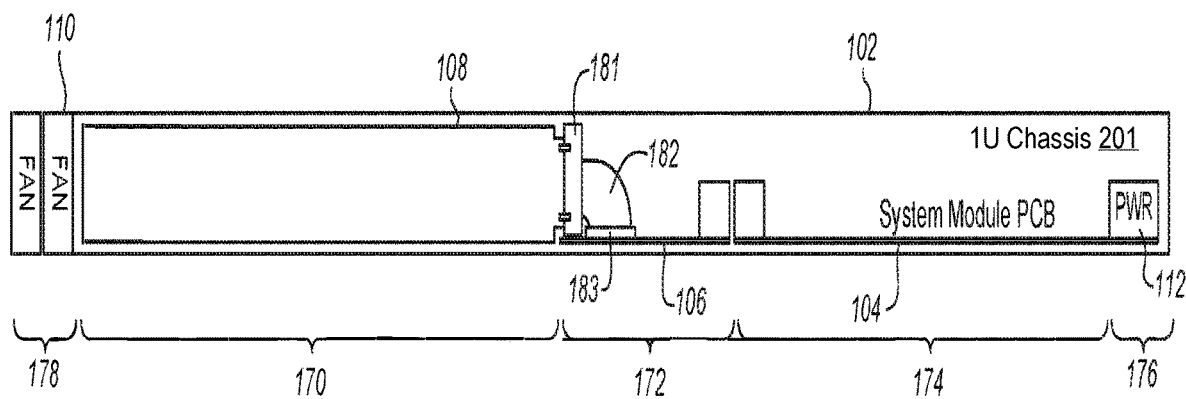
FIG. 1 cross-sectional side view diagram of memory system according to an embodiment.

FIG. 1 is a cross-sectional side view diagram of an example of a rack-mount chassis 201 and enclosure to accommodate the RSMs as described herein. The system has an enclosure 102 which in this case is a 1 U height rack mount enclosure. The enclosure is configured to mount in a particular type of standardized rack that has airflow from the front or left as shown in the diagram to the rear or right as shown in the diagram. The rear is configured for cabling. The 25 enclosure is about 19" (483 mm) wide and 33" (840 mm) deep. The 1 U form factor is 1.75" (44 mm) high. However, the particular width, height, and airflow direction may be adapted to suit other form factors.

The enclosure 102 carries a system module PCB (printed circuit board) 104 proximate the rear of the enclosure, a midplane PCB 106 near the middle of the enclosure and an array of RSMs (also referred to herein as "ruler SSDs" and "memory cards") 108 proximate the front of the enclosure. An array of fans 110 is mounted to the front of the enclosure to draw air into the enclosure and push it between and across the RSMs and to the rear of the enclosure. One or more power supplies 112 are mounted at the rear of the enclosure and may also have fans to draw air from the enclosure and push it out the rear of the enclosure. There may be additional fans along the chassis from front to rear. Rear fans may be used to pull air from the front across the chassis. Fans may be used in the middle of the chassis in addition to or instead of the front or rear fans to pull air in from the front and push it out the rear.

The configuration may be considered to have three zones a front memory zone 170 that in this example is about 16" (400 mm) deep, a central midplane zone 172 that is about 8" (200 mm) deep and a rear power supply and compute zone 174 that is also about 8" (200 mm) deep. The relative sizes of these zones may be adapted to suit different configurations. The memory array consumes about half of the enclosure so that the rear half of the enclosure may be configured to suit different applications of the system.

In the memory card zone 170, the parallel memory cards extend from a position proximate the front of the enclosure toward the rear of the enclosure. This is followed by the switching zone 172 proximate the front of the enclosure and connected to the memory cards to carry a switch fabric. This is where the midplane lies. The rear zone 174 has power supply and management between the memory card zone and a rear of the enclosure. This zone may also be the switch zone that carries the switch fabric. In this case the midplane carries only a connector matrix to couple the power supply and management zone to the memory card zone. This middle zone may also be a compute zone which performs computations using values stored in the memory card zone.

The system may also be considered to have a rear fan zone 176 between the power supply and management zone and the rear of the enclosure to pull air from the memory card zone out the rear of the enclosure. The rear fan zone cooperates with a front fan zone 178 between the memory cards and the front of the enclosure to push air from outside the enclosure to the memory card zone.

The front fans and the rear power supply provide a push of air from the front and a pull of air from the rear to establish air flow across the RSMs, the midplane and the system module. The number and arrangement of the fans may be modified to suit the cooling and module requirements of the system. The system may have no front fans or no power supply fans and rely only on the push or the pull or both. While common power supplies include fans, the power supplies may not have fans. Instead separate rear fans may be used. Additional rear fans may be used to supplement the pull of the power supply fans. In some embodiments, the power supplies are provided in a separate enclosure and rear fans may be used without power supplies.

The system module 104 may be provided to suit different requirements, depending on the intended use of the system. The system module may be a data interface or a switching interface to connect the RSMs to external connectors through wired or wireless interfaces. It may include a memory controller to manage access to the RSMs and provide memory management and maintenance. It may include a data processing system to provide server, computing, and other functions between the RSMs and external devices.

The midplane 106 provides a connection between the RSMs and the system module, including a power interface to the RSMs. As shown, there is a connector (also referred to herein as a "card connector" and a "card edge connector") 181 at the end of each RSM and a connector (also referred to herein as a "slot connector") 183 on the midplane for each RSM. An interface connector 182 connects each RSM to each midplane connector. The end connector allows the RSM to be pulled laterally or horizontally out of the interface connector and out of the chassis with no upward movement.

The midplane may also provide memory management and mapping between the RSMs and the system module. As shown, the midplane PCB is mounted horizontally and orthogonal to the RSMs. The horizontal orientation of the midplane eliminates the need to design cavities into the midplane to accommodate air flow. This greatly simplifies midplane design and signal routing.

The RSMs 108 contain all the flash memory, such as NAND flash and the memory controllers that are needed to store user data. Each RSM also works as part of an airflow channel for guiding the air that is blown in by the front mounted fans and blown out by the fans in the power supplies in a push-pull model. By using thin and long form factor SSDs in a single row format, the surface area of the SSD card is maximized, with excellent airflow characteristics. By using the interface connector between the horizontal midplane and the orthogonal RSM, air can flow between the interface connectors to the rear of the chassis.

With the vertical and parallel flash modules extending orthogonal to the midplane, the storage may be very dense. All the area is being effectively used, with excellent airflow characteristics. Using 32 RSMs with 32 TB capacity in a 19" SSD enclosure, the system could have a storage density of up to 1 PetaByte in a 1 U height rack chassis. Emerging 3D NAND chips allow for 1 TB of NAND memory on a single chip. By placing 18 such chips on each side of each RSM and placing 32 RSMs in the enclosure a 1 U 19" Storage system can replace two full racks of 1 TB HDDs. The parallel orthogonal RSM configuration allows for very tight RSM-to-RSM spacing so that more RSMs may be fit into a single chassis system enclosure while maintaining very good air flow for system cooling.

Figure 2:
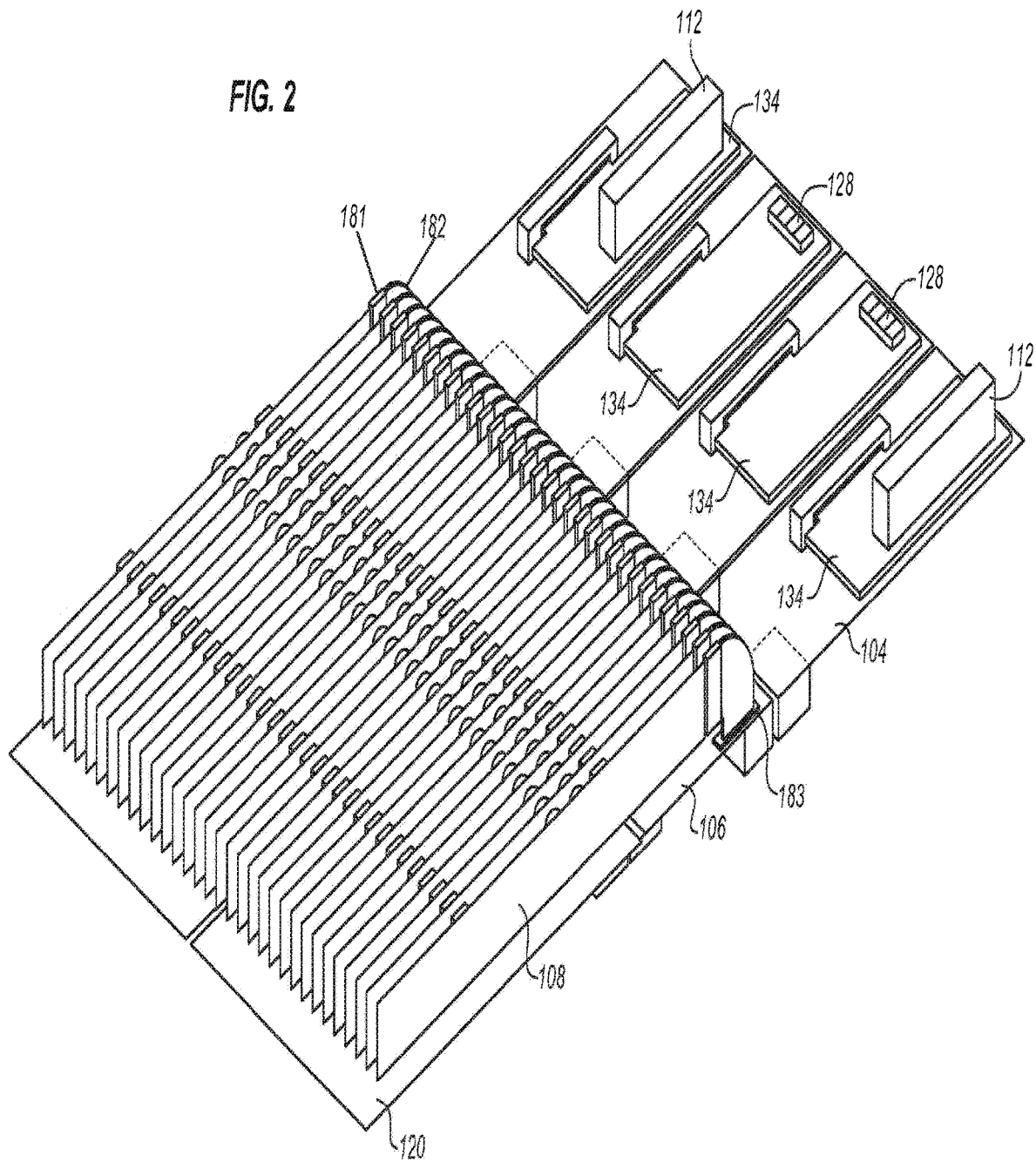
FIG. 2 is an isometric view of a memory system with a top cover removed according to an embodiment.

FIG. 2 is an isometric view diagram of a variation of the system of FIG. 1 with the top cover and side walls of the enclosure removed. There are several fans (not shown) in the front pulling air from outside, followed by 32 Ruler SSDs 108 followed by modular connectivity and compute modules at the back. There are two redundant power supplies 112 on the sides at the back of the enclosure. These power supplies have fans which are pushing air out of the box.

The memory, storage rulers, or RSMs are carried and supported by a bottom plate 120 of the enclosure. The bottom plate provides vertical support and may also have grooves or slots (not shown) to hold each RSM in place including to hold the rulers parallel to each other to support air flow. The RSMs are attached to the midplane by connectors 181 at the rear for data communications and power with the midplane. There is also an array of slot connectors 183 in the horizontal midplane to attach through interface connector 182 to the rear edge of the RSMs. The interface connectors do not interfere with airflow between the RSMs. The midplane may also have slots or grooves to guide and hold the bottom edge of the RSM in place.

The system board 104 in this example is an interchangeable component that may be selected for different connection configurations. As shown, there are four system boards. Each one has a switching complex 134 to provide switching between the different RSMs and an interface 128 that provides connections to external components. The interface may take any of a variety of different forms depending on the system needs. The interface may be a network interface, a storage array interface, or a direct memory connection interface.

PCIe (Peripheral Component Interconnect express) interconnect with an NVMe (Non-Volatile Memory express) storage protocol may be supported by the switching fabric 134 and the external interface 128. In this case, the NVMe is supported at the external interface and may also be supported in the connection to each RSM as well as within each RSM. Other PCIe interconnect protocols may alternatively be used. In addition SAS (Serial Attached Small computer system interface), SATA (Serial Advanced Technology Attachment), or other related, similar or different storage protocols may be used.

Figure 3:
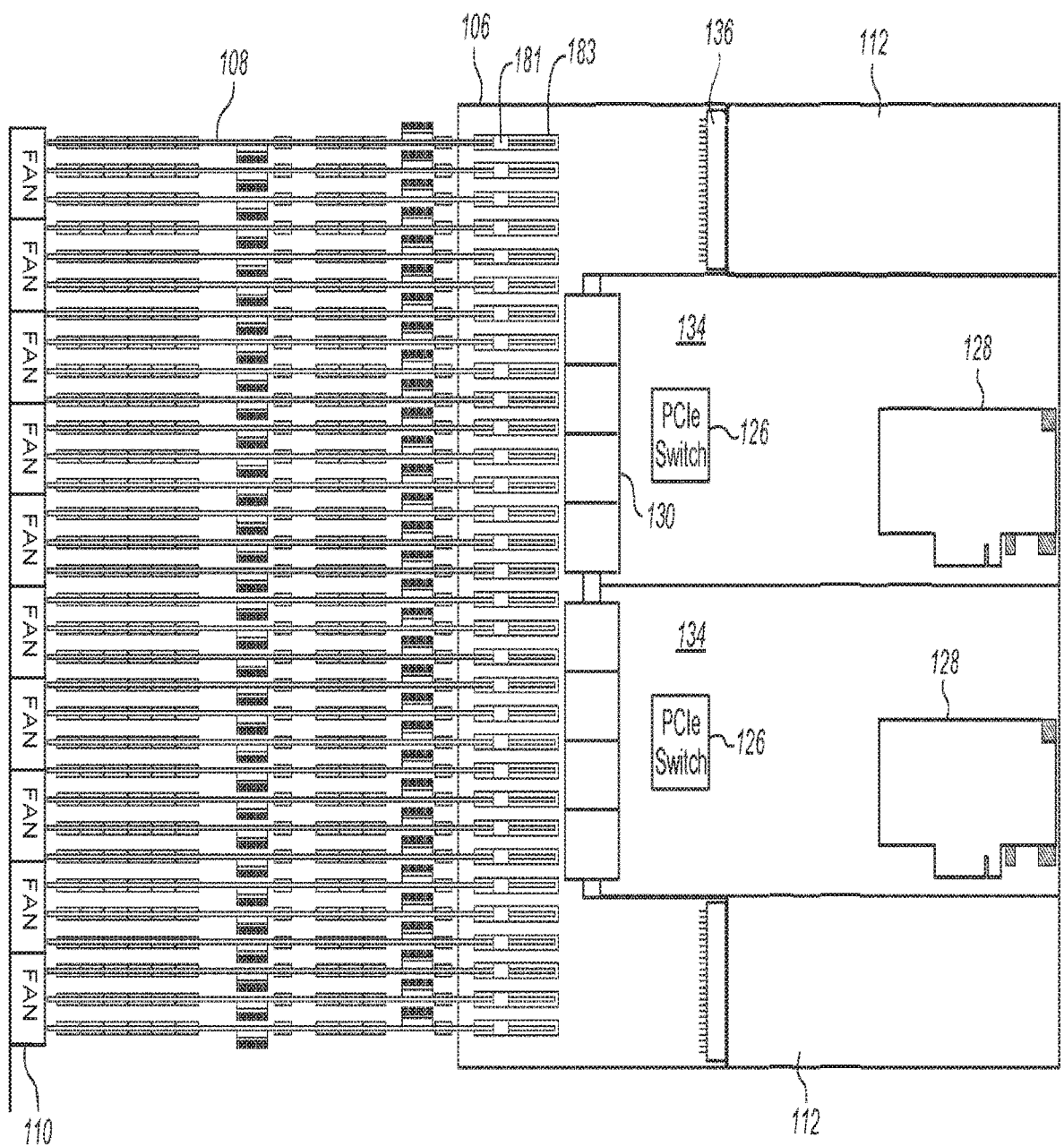
FIG. 3 is a top plan view of a memory system with a top cover removed according to an embodiment.

FIG. 3 is a top view diagram of a further variation of the memory system of FIG. 2. A high level architecture is shown of a variation of a 19″ SSD. The array of fans 110 are at the front of the enclosure and blow air across the array of SSDs 108. In this example there are 10 fans to blow air across 32 SSD memory cards. The precise number of fans may be adapted to suit the dimensions of the enclosure and particular type and configuration of fan and any other guides, shrouds, or other structures. The cards are placed vertically and aligned to be parallel to each other. The cards connect to a midplane 106 that has 32 connectors 183, one for each card. The connectors are at the rear end of the card. The connector may take a variety of different forms. The midplane is connected to a system module. The system module PCB is not visible in this view because it is covered by other components.

The midplane is coupled through a power connector 136 on left and right sides of the midplane (top and bottom as shown) to a left and right side power supply 112. These power supplies may be complementary or redundant and the midplane may be wired so that both power supplies are coupled to each RSM.

The midplane base board is also coupled through an array of data connectors 130 to two switching modules 134. The left module serves the 16 RSMs on the left and the right module serves the 16 RSMs on the right. The RSMs may also be cross-coupled so that each RSM is coupled to both modules or connected in any of a variety of different patterns that include various types of redundancy.

The switching modules may contain any of a variety of different components, depending on the implementation. In this example, there is a PCIe switch 126 for each module and a network interface card (NIC) 128 for each module. The NICs allow for an Ethernet connection to external components. The Ethernet connection is converted to PCIe lanes for the RSMs. Each RSM may use one or more lanes of a PCIe interface depending on the speed and the amount of data for the particular implementation. The switching modules may also include system management sensors and controllers to regulate temperature, monitor wear and failures and report status. While switching modules are shown, other types of modules may be used including server computers that use the RSMs as a memory resource.

Figure 4:
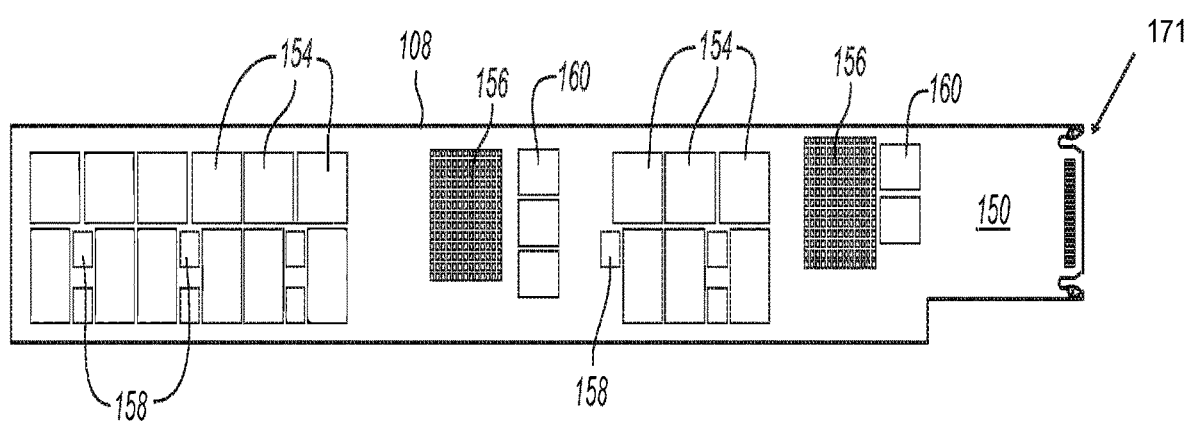
FIG. 4 is a side plan view of a memory card according to an embodiment.

FIG. 4 is a side plan view diagram of an RSM or memory card 108 suitable for use with the memory system as described herein. The card has a printed circuit board (PCB) structure 150 with a connector 171 to the midplane at one end. Multiple memory chips 154, in this case eighteen chips are mounted to one side of the PCB structure. There may be more or fewer depending on the application. Each memory chip generates heat with use and consumes power with read and write operations. The number of chips may be determined based on power, cost, heat, and capacity budgets. In some embodiments 3D NAND flash memory chips are used. However, other types of solid state memory may be used including PCM (Phase Change Memory), STTM (Spin Transfer Torque Memory), magnetic, polymer, and other types of memory.

The memory card further includes memory controllers 156 to control operations, manage cells, mapping, and read and write between the connector 152 and the memory chips 154. Fan out hubs 158 may be used to connect the memory controllers to the cells of each memory chip. Buffers 160 may also be used to support write, read, wear leveling, and move operations.

Figure 5:
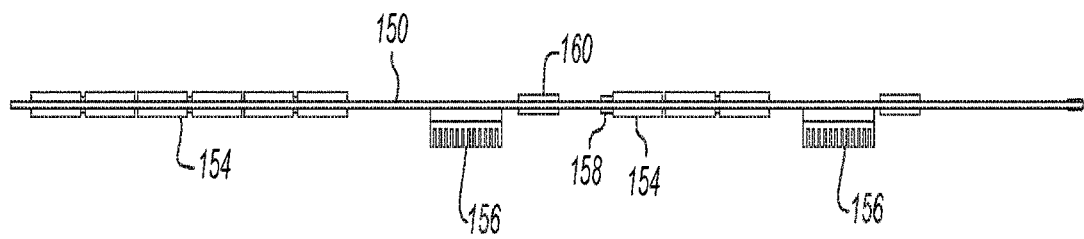
FIG. 5 is a top plan view of the memory card of FIG. 4.

FIG. 5 is a top view of the memory card of FIG. 4 showing the same components. The card may be configured to support more memory chips on the other side or only one side may be used, depending on the budget for power, heat, and capacity. The memory card may have heat sinks and exposed chip package surfaces as shown, or may be covered with one or more larger heat sinks or heat spreaders as well as protective covers.

The particular configuration and arrangement of the chips may be modified to suit requirements of different chips and to match up with wiring routing layers within the PCB. The buffers may be a part of the memory controllers or in addition to those in the memory controllers. There may be additional components (not shown) for system status and management. Sensors may be mounted to the RSM to report conditions to the memory controller or through the connector to an external controller or both.

The RSM allows a large amount of NAND flash memory to be packed into a small design. In this example with 1 TB of memory per NAND chip 154, 36 TB of memory may be carried on a single memory card. This amount may be reduced for lower cost, power, and heat and still use the same form factor. The Ruler Storage Module is shown with an end connector. This allows modules to be replaced without removing a top cover of the chassis even for a top serviceable enclosure. The memory modules may be removed and replaced simply by moving fans or access panels at the front. Typical equipment racks allow the enclosure to slide forward to allow access without removing the enclosure from the rack but this is not required to service only the memory.

The Ruler Storage Module provides optimized airflow and a maximal surface area for storage media. This new storage module allows for a 1 U high, extremely dense SSD solution. This new storage module form factor does not hinder airflow in the system and yet is dense enough to provide a great advantage over existing form factors that were developed for other purposes, such as 2.5" notebook drives, AIC (Advanced Industrial Computer) memory, M.2 cards, and Gum-stick memory (typical USB stick style configurations). Some of these form factors cannot be used in a 1 U height enclosure in any arrangement.

The RSMs provide quick and secure connections and may be configured to be hot-swappable in some systems. Using modular compute and connectivity blocks for the 19" SSD system described herein, one can easily, without system shut-down, swap out a compute module and insert a new compute module with varying compute horsepower, depending upon the storage solution requirements, within the 19" SSD enclosure. For example, a low power compute module, such as an Intel® Atom® processor-based system may be used for storage targets that need mid-range compute capabilities, such as Simple Block Mode Storage, NVMe over Fabrics, iSCSI/SER, Fiber Channel, NAS (Network Attached Storage), NFS (Network File System), SMB3 (Server Message Block), Object store, distributed file system etc. A higher performance processor on the compute module may be used for Ceph nodes, Open Stack Object, Custom Storage Services and Key/Value Stores. For very high performance, the computing module may be in a different enclosure on the same or another rack and connected using PCIe switches or another memory interface.

In addition to providing interchangeable RSMs, the same chassis and enclosure may allow for the system modules to be interchangeable. This may allow for different connectivity modules to be used. The system may be upgraded to a different storage protocol (e.g. NVMe over Fabric RDMA (Remote Direct Memory Access), iSCSI (internet SCSI), NVMe, PCIe, or even Ethernet) without changing any of the RSMs. This modularity also enables two modules to be used for redundancy and fail-over in some applications (e.g. traditional enterprise storage) and a single module for other applications (e.g. cloud computing).

Figure 6:
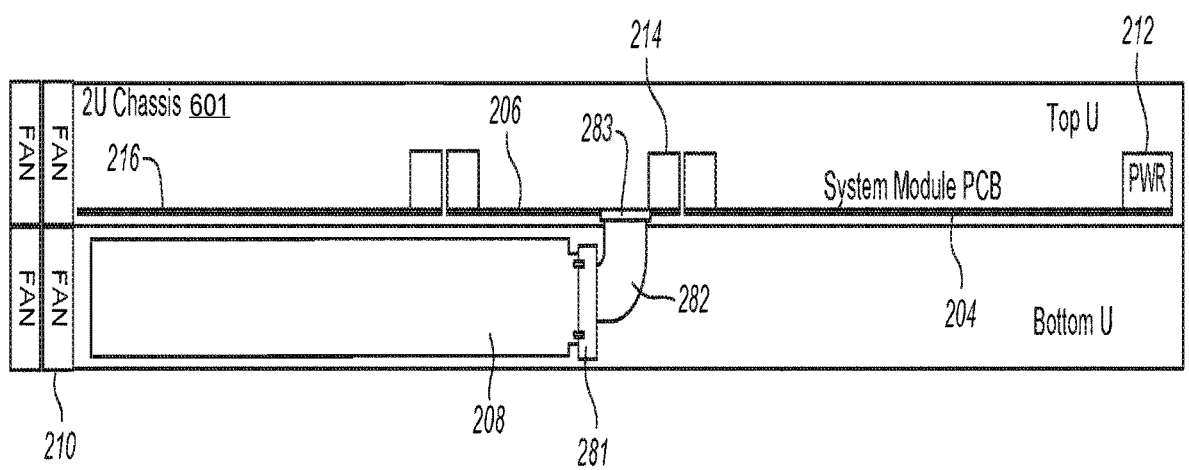
FIG. 6 is a cross-sectional side view diagram of an alternative memory system according to an embodiment.

FIG. 6 is a diagram of an alternative chassis enclosure for a 2 U (3.5" or 89 mm) rack height. In this enclosure, the same memory card configuration is used for 1 PB plus of storage. The additional height allows for additional computing and switching components to be included with short fast connections to the memory. In this example, there is an array of memory cards 208 proximate the front of the enclosure coupled through connectors 281, 282, 283 to a midplane PCB 206 near the center of the enclosure. The midplane is coupled through connectors 214 to a system module PCB 204 at the rear of the enclosure. There is a front fan zone with an array of fans 210 to push air across the memory cards 208 and a rear power supply 212 fastened to or adjacent to the system module PCB 204 proximate the rear of the enclosure to pull air out of the chassis 601.

In contrast to the 1 U configuration, the system module may be on either the lower or upper side of the enclosure. The RSMs have the same configuration and therefore use only one half of the 2 U chassis. In this example, the RSMs are in the lower half of the enclosure but could alternatively be in the upper half. The system module is in the upper half opposite the RSMs. Due to the PCB structure of the midplane and the system module, the PCBs are in the center of the enclosure and horizontal while the components on the PCBs extend vertically from the PCBs into the upper half of the enclosure. An additional system module (not shown) may also be added to the lower half of the enclosure at the rear of the enclosure.

The 2 U configuration also allows an additional system module PCB 216 to be added at the front of the enclosure above the RSMs. As mentioned, the RSMs may be in the upper half, in which case, the additional system module may be in the lower half instead. The additional system module may be used to provide computing power or additional switch fabric. As an example, the rear system module may be used as interface, switch fabric, and power supply, while the front system module is used as a computing zone with microprocessors and memory for low power or high power computing. Alternatively, the front system module or an additional rear module may be used for PCIe adapter cards for graphics rendering, audio or video processing, or other specialized tasks.

Figure 7:
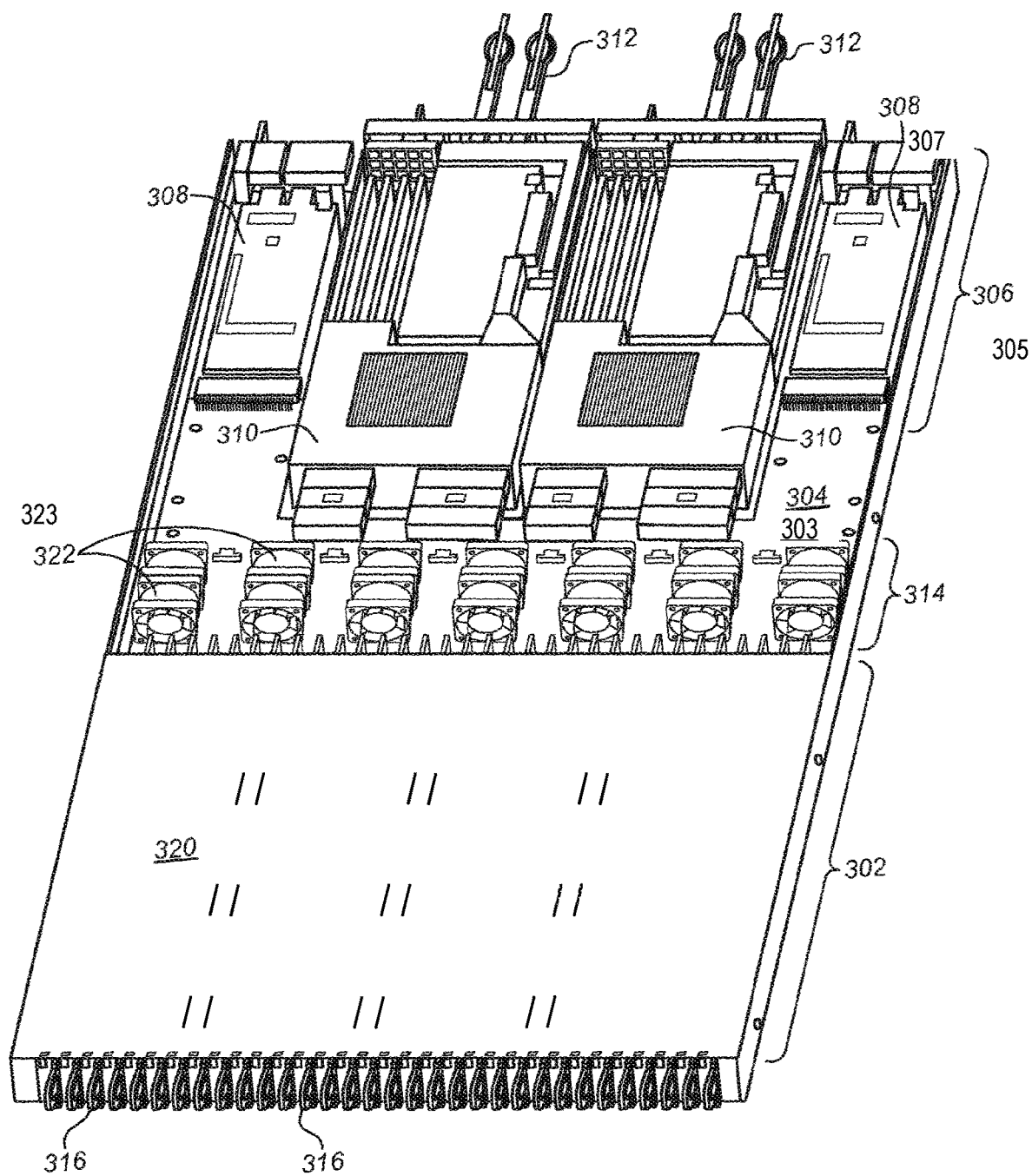
FIG. 7 is an isometric view of another alternative memory system according to an embodiment.

FIG. 7 is an isometric diagram of an alternative chassis enclosure for a 1 U rack height. This configuration may be augmented by an extra layer for additional computing, switching, interface, or power supply resources. The front of the chassis has a memory or RSM zone 302. In this example, the rulers are covered by a top cover 320 which may also act to guide air across and between the rulers. A horizontal plane board in the form of a midplane 304 is directly beneath and coupled to the rulers. The rulers extend orthogonally upward from the top side of the midplane. A power supply and management zone 305 includes power supplies 307 on either side of the enclosure. Compute modules 310 are placed side-by-side between the power supplies 307 and proximate the rear of the enclosure. The compute modules include external interface components that couple to cabling. The cabling connects the memory system to external component on another position on the rack or to another rack. As in all of the other embodiments, the compute modules may be limited to serving and storing data and converting to and from different formats. The compute modules may be more powerful and able to perform simple tasks at low energy or more complex computation and modeling tasks, depending on the particular implementation. A fan zone 314 is placed near the center of the enclosure with an array of fans 323 across the width of the chassis. There are seven fans in this example, but there may be more or fewer as mentioned above. The fans pull air from the front of the chassis between the memory rulers and then push it out the rear of the enclosure. They may be helped by the power supply and compute module fans, if any, and by additional rear fans, if any. The intermediate fan zone is placed between the memory rulers and the power supplies on the same side of the midplane as the memory rulers.

In this example there are no front fans shown. Front fans may be used to improve air flow or reduce the load on the middle fans. Instead the memory rulers have handles 316 at the front of the enclosure to allow access to the respective ruler. Fans may be mounted in front of these handles, in which case, the fans may be moved to access the memory rulers. The front handles allow for front access to the memory rulers without sliding the chassis forward in the rack as with the top mounted version described above.

Figure 8:
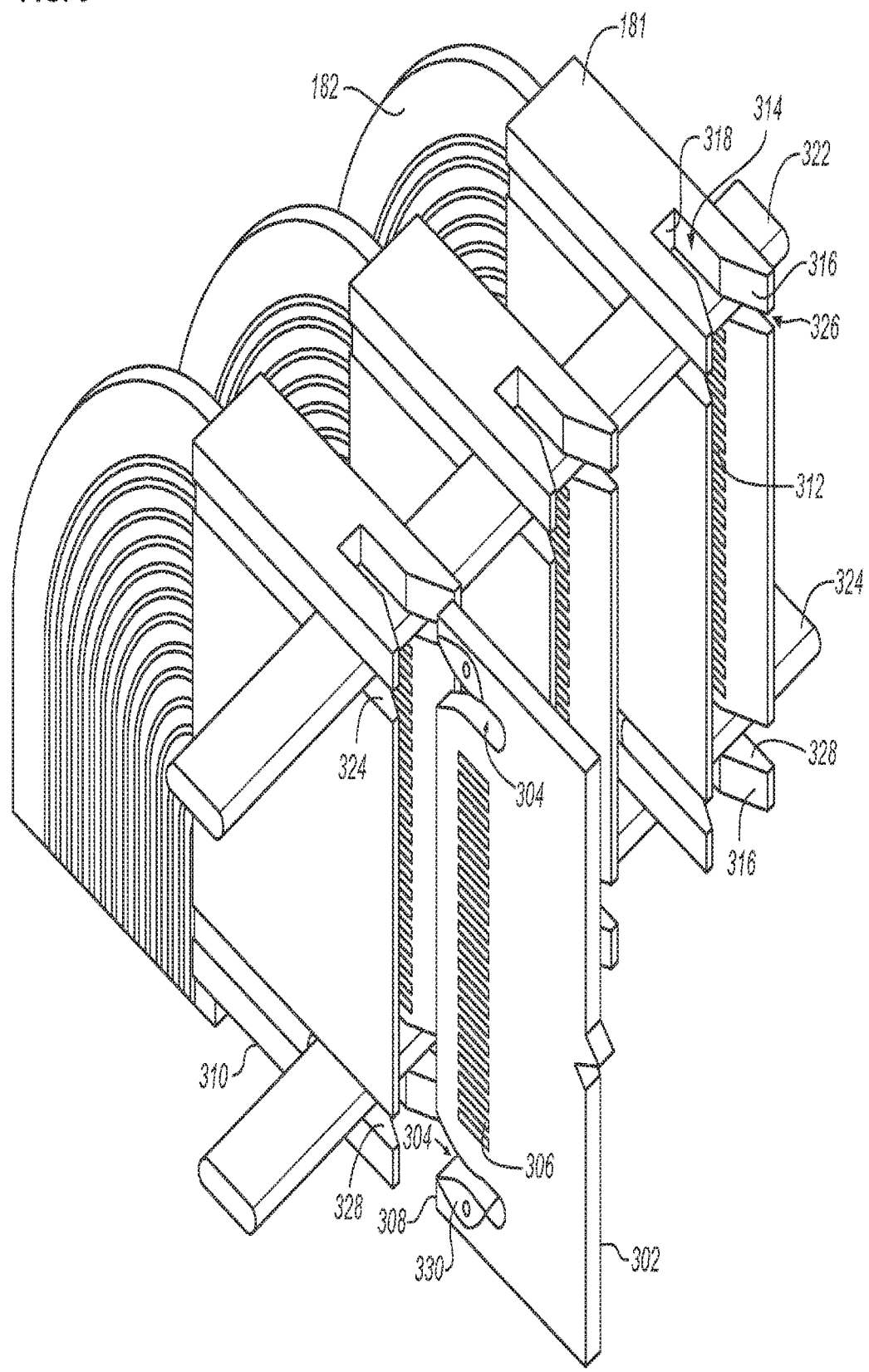
FIG. 8 is an isometric diagram of a portion of a row of memory to midplane connectors and a memory card according to an embodiment.

FIG. 8 is an isometric diagram of a portion of a row of memory-to-midplane connectors (e.g., connectors 181, 182, 183) in more detail. In this diagram there are three card connectors 181, each coupled to an interface connector 182, and one memory card 302. In the illustrated examples, this is just a portion of the connectors that may be used for all 32 memory cards, however, the number and positioning of the memory cards may be adapted to suit different circumstances. The memory card 302 may be made of a variety of different printed circuit board materials. The end of the card may be formed of the PCB material or a special attachment fixture may be fastened to the end of the card that has a configuration similar to that shown. The end of the memory card as shown has a slot 304 at the top and the bottom of the edge of the card and a set of copper contacts between the two slots.

The slots 304 at the top and the bottom of the rear or back edge of the memory card are defined, in part, by fingers 308 that extend from the ends of the card. The fingers and the slots mate with corresponding constructions in the card connector 181. The connector has a card slot 312 for the memory card that extends vertically and orthogonal to the midplane and has a set of matching conductors to make electrical contact with the memory card. The connector is formed of a suitable polymer material that is moderately compliant so that the memory card is wedged into the slot of the connector. The conductor provides a data connection between the midplane and the memory card and may also provide power, control, system management and other types of service and communication between the midplane and the memory card.

The connector 312 further includes a guide 314 at the top and the bottom with angled leading edges 316. The leading edges push the fingers of the card into alignment so that the electrical contacts are aligned. The guides then hold the card in alignment after the connection is made. The guides have a stop 318 at the back. As the card is pushed into the connector, the fingers are pushed into proper alignment. The angled edges of the fingers 308 push the card into horizontal alignment and the movement of the card is stopped when the fingers are pushed against the respective stops 318 at the back of the connector. The finger is limited in its horizontal movement when it hits the stop at the back of the guide. With two fingers one, at each end of the card, the stops ensure that the memory card is moved into its proper position in the interface connector socket when the fingers hit the stops.

The connector also optionally carries bus bars to provide a common connection for multiple memory cards for power (bus bar 324) and for ground (bus bar 322). The bus bars extend across and through all three connectors and rest within a respective ledge 328, 326 of each connector for a common power supply for all three memory cards. The bus bars may extend across all 32 connectors in a chassis or the bus bars may be divided into sections based on the power supply, the memory interface or another criterion. With a single power and ground bus bar for all of the memory cards, the bus bars may be used to bridge power from multiple power supplies. With bus bars that each serves, for example, eight connectors each, the bus bars may be isolated to particular groups of memory cards to aid with memory card management as groups. The bus bars may be fastened in place so that they are not moved by the insertion or removal of a memory card.

When bus bars are used each memory card may be configured so that the finger 308 at each end of the rear edge of the card engages a respective bus bar. In this case, the upper finger is pushed upward by the upper ground bus bar and the lower finger is pushed downward by the lower power bus bar. The counter direction forces push the memory card both up and down to secure the memory card in a vertical position. As shown each finger also has a metal contact 330 to electrically engage the respective bus bar and conduct the power to wiring layers of the memory card. Using the bus bars and the fingers, the memory card may be wedged into place and secured against vertical movement. The memory card is also wedged into place in the slot of the connector to secure the card against horizontal movement.

While only top and bottom power bus bars (Vdd and GND) are shown, these bars may be at a different position on the connector and there may be more or fewer bus bar connectors. The electrical contacts in the slot may be used to provide one or the other of the power supplies or to augment the power supply with other voltages or frequencies.

The connector body and bus bar elements may be engineered to naturally guide and align the RSM into a mating position with high precision during insertion into the system. This allows additional alignment componentry such as guide pins and sockets to be avoided. Even with the bus bars there is still a significant amount of vertical space for the slot and the electrical connections. These may be copper or gold fingered matings.

As an example, for a roughly 1 U (about 40 mm) high RSM, with 0.8 mm pitch and with about 15 mm for the bus bar fingers more than 30 pins or contacts may be accommodated on each side of the connector or 60 pins on both sides. 60 pins is more than enough to support a variety of different data and control signalling connections such as 4 lanes of PCIe Gen3 or Gen 4, e.g. PCIe G4. PCIe may be configured as a single 1×4 port, or 2×2 active dual ports. There are also enough pins for up to 2 ports of 2.5 Gbs Ethernet (2.5GE).

Finally an interface connector (also referred to as a quarter-circle connection) 182 is provided at the back of each connector 181 for a thin profile connector that does not restrict airflow on either side of each memory card. This allows the connector body to be very narrow. Air flow is not impeded since the data signals are routed through the connector and power is provided using the top and bottom bus bars. The narrow quarter circle connectors also allow for a very tight RSM-to-RSM spacing so more modules can be fit into a system while maintaining very good air flow for system cooling. While these connectors are shown as and described as quarter-circle connectors they may take any of a variety of other shapes to connect a vertical connector to a horizontal connector.

As shown, the memory cards extend horizontally from the front toward the rear of the enclosure and each memory card extends vertically from the horizontal midplane board. The quarter circle connectors similarly extend horizontally from the edge connector at the end of each memory card and also vertically from the horizontal midplane board. The quarter circle of the interface connectors provides a transition from the horizontal to the vertical but since the PCB of each interface connector extends from the end of each card and is vertically aligned and parallel with the respective memory card, airflow between the memory cards also flows between the vertical and parallel interface connectors.

The bus bar power distribution allows for a very high current to be provided to each RSM. The high level of power allows for large memory arrays and high speed routing and control devices. The bus bars may be used to provide more power than the contacts within the slot connector is able to sustain. As a result, higher capacity and higher speed memory cards may be used as memory density continues to improve.

In addition, the bus bar power distribution system protects the midplane structure from potential damage in the case of an electrical short in a high power RSM module. Damage is confined to the RSM and will not affect the midplane or the other chassis level infrastructure which is more difficult to repair. The other RSM modules and the chassis infrastructure are unaffected and may continue to operate until replacement parts and service are arranged.

The bus bars also enhance the structural rigidity of the connectors. By connecting all or some of the connectors together, the connectors reinforce each other by transferring forces through the bus bars. Any force on one connector, for example when removing or installing an RMS will be transferred to the neighboring connectors through the bus bars which will help to hold the connector in place. The bus bars may have some form of insulator coating along the entire length except where contact is made with a memory card finger. Covering the exposed surfaces of the bus bars reduces the chance of an accidental shorting caused by debris or other loose articles in the housing. Internal surfaces where the RSM module fingers mate with the connector are exposed for power conduction.

Figure 9:
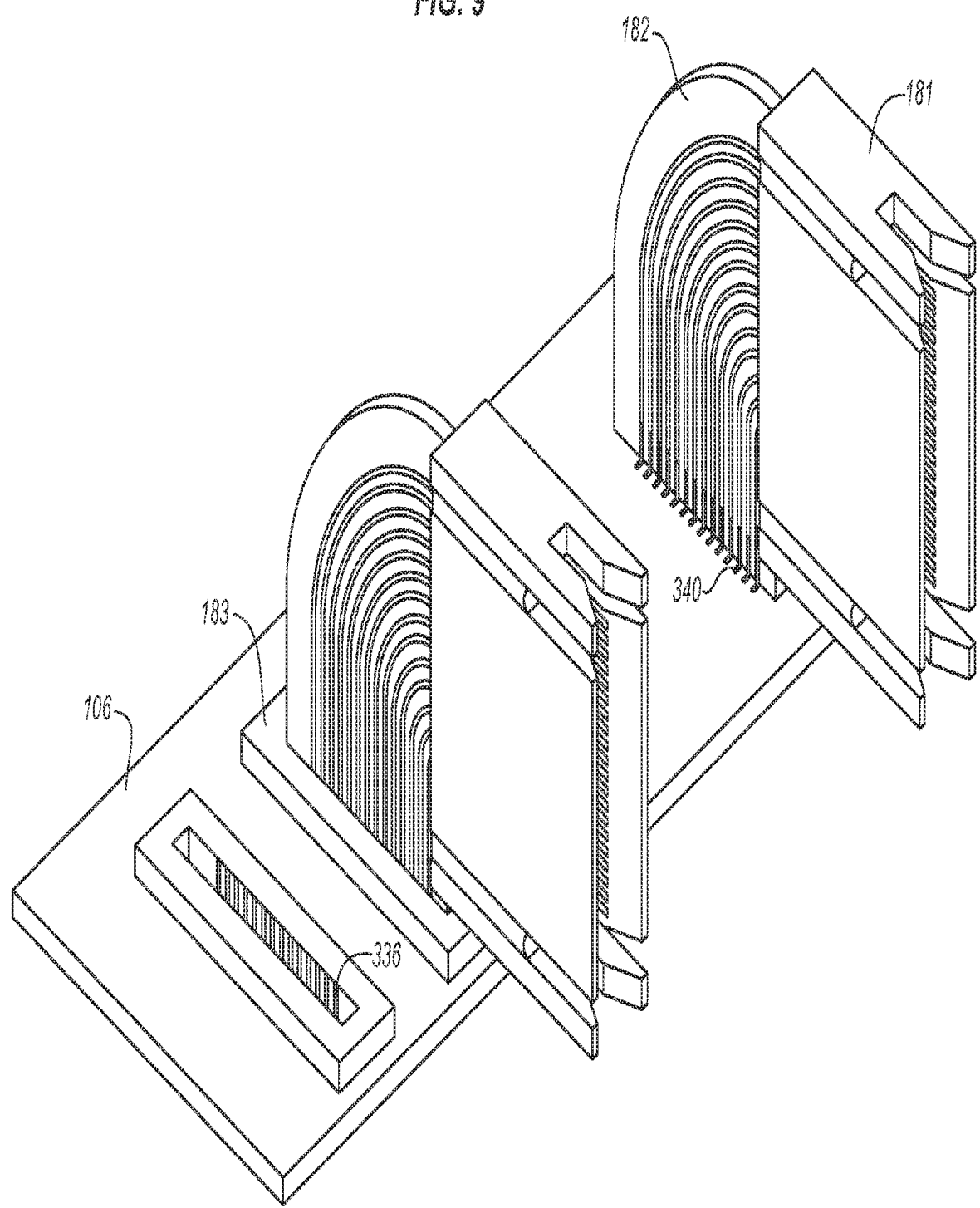
FIG. 9 is an isometric diagram of two different configurations of a memory to midplane connectors according to an embodiment.

FIG. 9 shows an example of how the quarter circle interface connectors 182 connect a midplane 106 connector 183 to a card edge connector 181. The midplane has an array of electrical connector slots installed onto or into the midplane PCB 106. These slots have an array e.g. 30 on each side, of electrical contacts 336. The midplane slot contacts engage with corresponding contacts on the interface connector. The slots are arranged vertically upward so that the interface connector is pushed down into the midplane connector. The interface connector may be wedged into place by angled sides of the midplane connector or a latch, tab, lock, or similar mechanism may be used. The card connector 181 slides into place in a similar way on the other side of the interface connector 182. The card connector may also be attached to the midplane with latches, tabs or some other feature to prevent horizontal motion and release from the interface connector.

In an alternative embodiment, there is no midplane connector slot 183. Instead the midplane PCB has a set of pads or lands 340 to connect to the interface connector and the interface connector has a series of mating tail connectors. The interface connector may then be soldered into place on the midplane PCB to make connections and hold the interface connector in place. The described connector topology may be used with either a card edge or a solder tail connection to the midplane structures. The card edge approach provides mechanical flexibility, particularly for dual port type configurations, while the solder tail connection will have superior signal integrity, higher mechanical strength and fewer failure modes. As shown, the horizontal orientation of the midplane eliminates the need to design cavities into the midplane to accommodate air flow. This greatly simplifies midplane design and signal routing.

Figure 10:
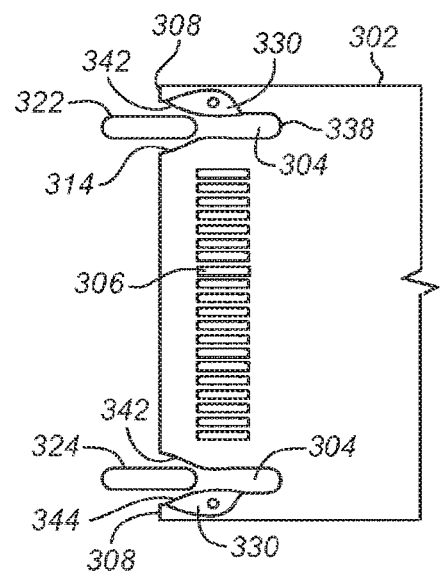
FIG. 10 is a side view diagram of the rear edge of a memory card according to an embodiment.

FIG. 10 is a side view diagram of the rear edge an RSM, such as the memory card described above. While the memory card has a very specific shape, the features are those that may be formed using conventional PCB materials and techniques. The edge of the card 302 has a row of contacts 306 that may be formed from wiring layers in or on the PCB. The connectors may be copper or plated copper with gold, silver or any other desired material. The top and the bottom of the memory card have fingers 308 formed by creating a slot 304 near the top and bottom of the edge of the card. Each slot is specifically shaped to receive a corresponding bus bar 322, 324. A metal connector 330 in each slot establishes a power connection with the respective bus bar and conducts the power to wiring layers of the memory card and from there to the chips and other components mounted on the memory card. These may be manufactured into the PCB or attached to the PCB. Attachment to the PCB reduces the stress on the PCB due to flexing.

The upper and lower slots have tapered guide surfaces on the upper 342 and lower 344 sides of each slot. The bus bars have curved edges and are flattened to slide into the corresponding slots. The tapered guide surfaces guide the edge of the card around the curved edges of the bus bar to align the card edge vertically with respect to the bus bars. The connector slots 304 also have a rear stop 338. This rear may be arranged to align with the rear stop of the connector slots 318 so that the bus bar hits the rear stop on the card edge at about the same position that the card edge finger 308 hits the rear of the connector stop 318. In this way the card is fixed in position and prevented from any further movement into the connectors.

The card edge connector on the RSM provides some advantages compared to a card edge connector on the backplane or midplane. For example, the PCB of the quarter circle interface connector may be made very thin. A thinner PCB is simpler and less expensive to manufacture and saves weight and material costs. The card edge connector on the RSM requires that the card connector 181 be designed to the width of the RSM module. If different size PCBs are to be used for different RSM modules, then the card connector 181 may be adapted to accommodate this change.

Figure 11:
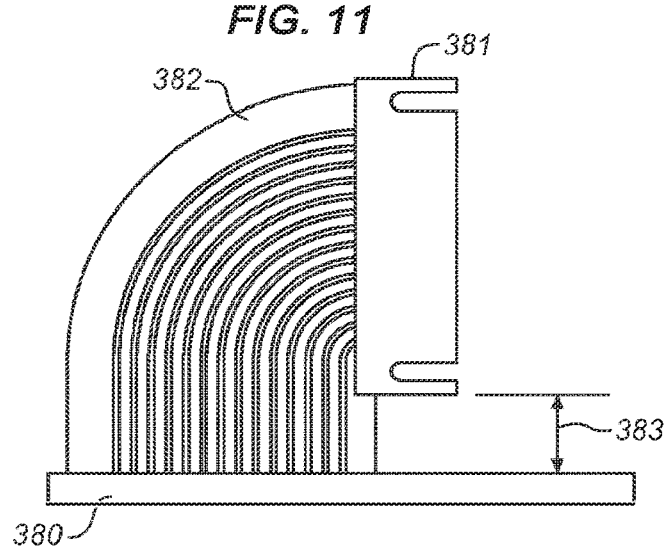
FIG. 11 is side view diagram of a memory to midplane connector with a first z-height according to an embodiment.

FIG. 11 is a side view diagram of a quarter circle connector 382 attached to system midplane 380 and to a memory card connector 381. This quarter circle connector is configured to provide a particular z-height 383 between the memory card connector and the midplane PCB.

Figure 12:
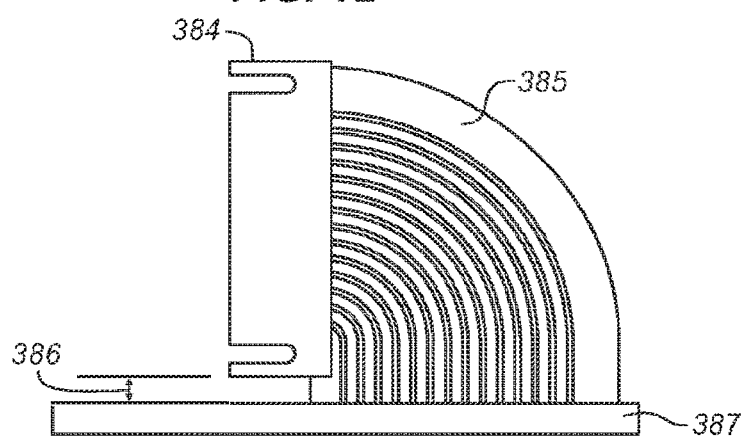
FIG. 12 is side view diagram of a memory to midplane connector with a second z-height according to an embodiment.

FIG. 12 is a side view diagram of a similar quarter circle connector 385 attached to a midplane PCB 387 and a memory card connector 384. This quarter circle connector is configured to provide a different smaller z-height 386 to accommodate different dimensions of a memory card. The PCB of the interface connector 382, 385 structures makes it possible to easily accommodate various z-height offsets from the midplane. Only the interface connector is changed. If the midplane uses card connector slots to attach to the interface connector, then different interface connectors 382, 385 may be quickly exchanged for different memory card configurations in the chassis.

Figure 13:
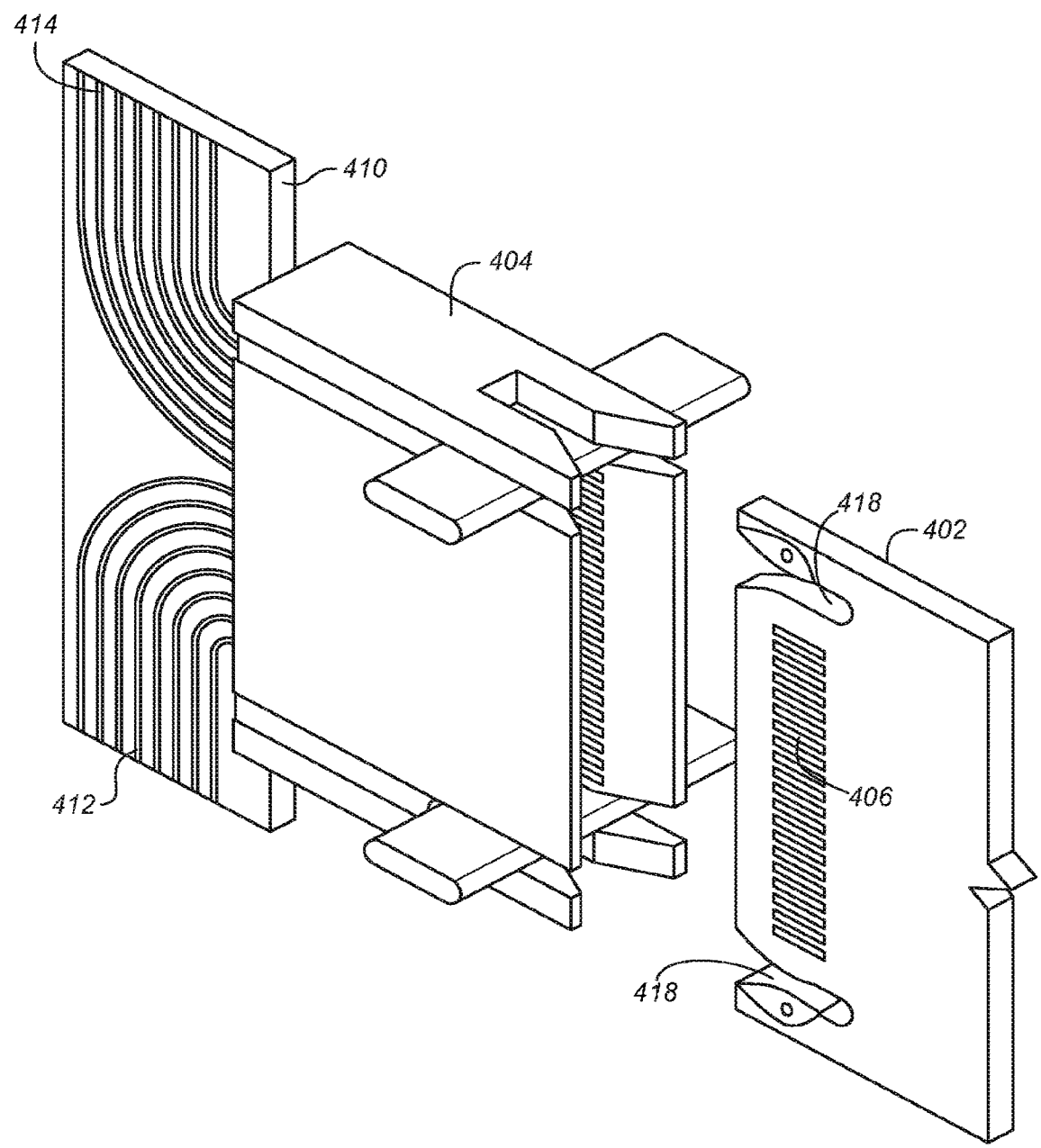
FIG. 13 is an isometric diagram of a portion of a memory card and an alternative memory to midplane connector with connections to two memory planes according to an embodiment.

FIG. 13 is an isometric view of an alternative quarter circle interface connector. In this example a memory card 402 has an edge connector to mate with a card connector 404. As described above the card edge has a row of contacts 406 on one or both side and slots 418 to slide over and engage bus bars 406. The card connector is coupled to a quarter circle interface connector 410. The interface connector 410 has a quarter circle wiring layer that extends horizontally away from the card connector and then vertically downward to a set of contacts 412 that make contact with another component such as a slot connector or a midplane or other PCB. The interface connector 410 also has a quarter circle wiring layer that extends in the opposite direction. This wiring layer extends horizontally away from the memory card and then vertically upward to contacts 414 on the interface connector for a different PCB, slot or other connection.

The illustrated interface connector allows a memory board to be simultaneously connected to two different components. The two connections may allow one part of the memory to connect to one component and another part of the memory to connect to a different component. Alternatively, all of the memory may connect to both components. The two components may be provided for redundancy or the two components may be different types of components. One component may be a switching interface and the other component may be a compute device or a different type of switching interface. There may be multiple computing devices to share the memory.

Figure 14:
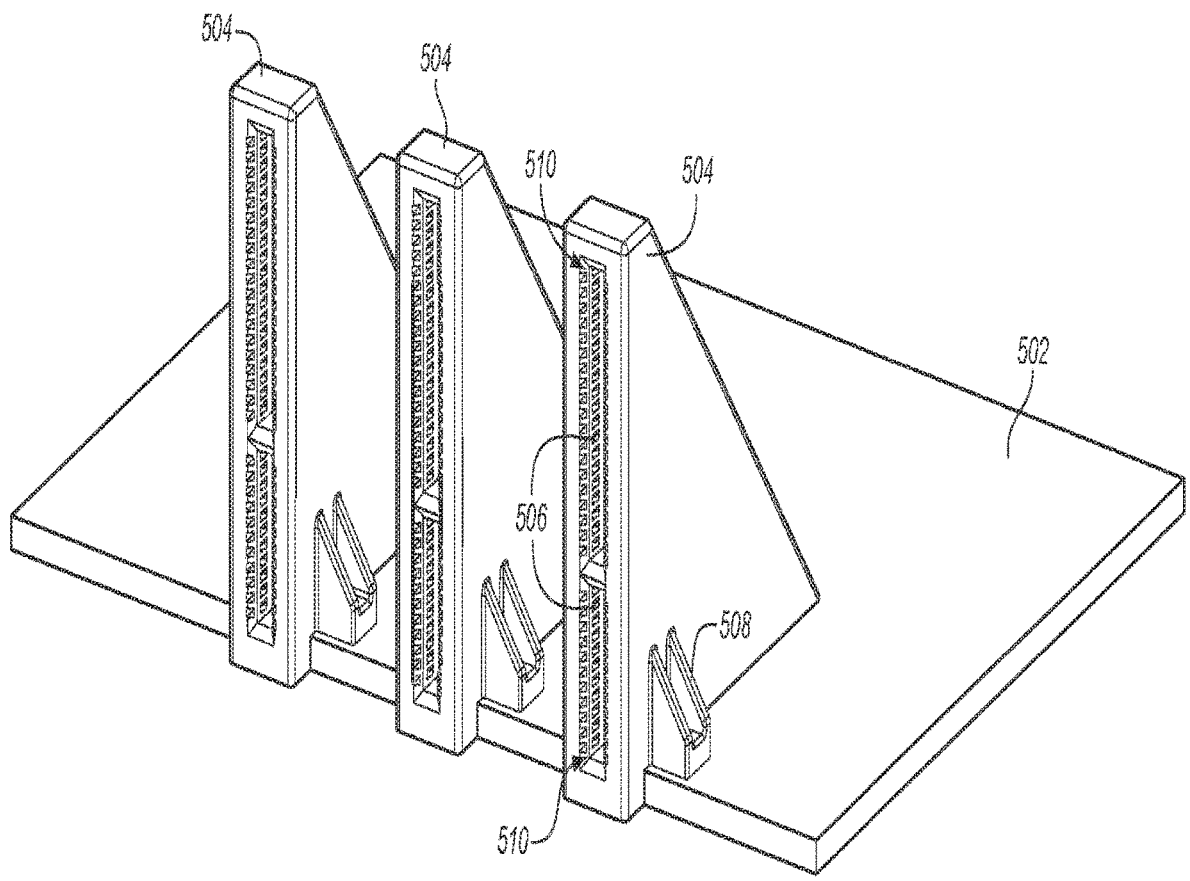
FIG. 14 is an isometric diagram of a portion of a row of alternative memory to midplane connectors according to an embodiment.

FIG. 14 is an isometric diagram of an alternative memory card connector and interface connector in which the two components are combined into a single interface connector structure. As shown a midplane (also referred to herein as a PCB or plane board) 502 or other horizontal PCB is mounted within a chassis (not shown). There is an array, for example, 32 of interface connectors 504 attached in a row to the PCB. The interface connectors may be attached directly to the PCB, e.g. by soldering onto pads, or inserted into a socket as shown above. Each interface connector has a slot 510 with an array of electrical contacts 506 to receive the edge of a memory card and make an electrical connection with the memory card.

The interface connectors also have legs 508 on one or both sides of each connector to stabilize the position of the connector on the PCB. These legs may rest against the PCB and may also be attached using solder, pins, tabs, latches, screws through the PCB, or another mechanism.

The slot has angled sides so that the memory card is guided into position horizontally and vertically and so that the memory card is also wedged into place within the slot. In this example, there are no separate bus bars. The power connections are made within the slot. In the same way, the previously described examples may also be made without bus bars. The bus bars improve the strength of the connector array but also add cost, complexity and the risk of short circuits and electrical shock.

Figure 15:
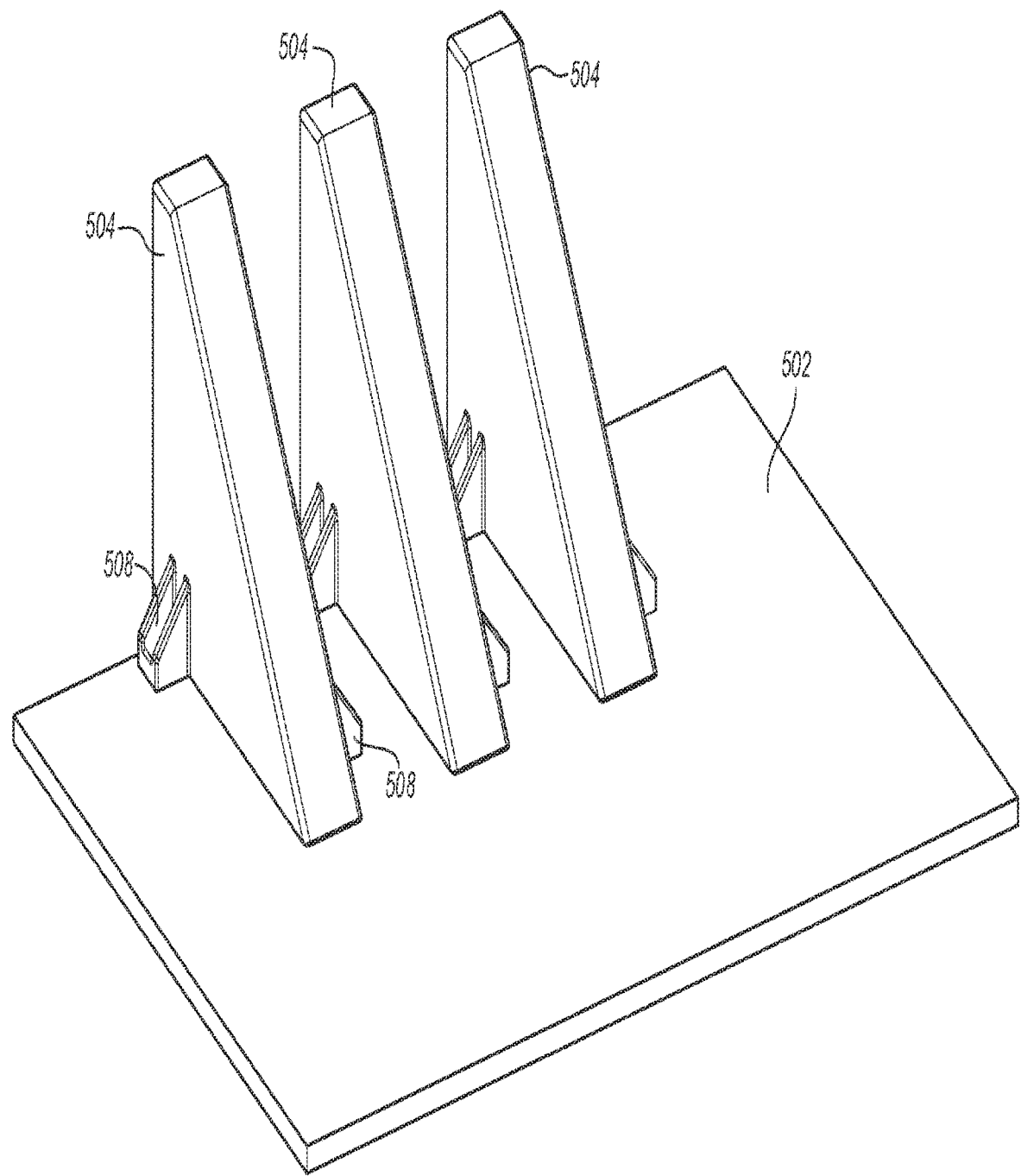
FIG. 15 is an isometric diagram of the memory to midplane connectors of FIG. 14 from the opposite side according to an embodiment.

FIG. 15 is an isometric view of the same interface connectors 504 mounted to the PCB 502 as seen from the opposite side. As with the other examples, the connectors are parallel and in a single row. There is a space between each connector to allow airflow between them. As a result, cooling air may flow across and between the memory cards and continue past the connectors to the rear of the enclosure.

The interface connectors of FIGS. 14 and 15 may be used by sliding a memory card into position from the front of the enclosure. The card edge connector slides into the slot and makes electrical contact. The slot holds the card vertically orthogonal to the plane board 502 upon which the connector is attached. The card may also be held in position by grooves or slots in the enclosure at the other end of the memory card. Handles 316 at the front of the enclosure allow memory cards to be pulled out so that other memory cards may be pushed in.

Figure 16:
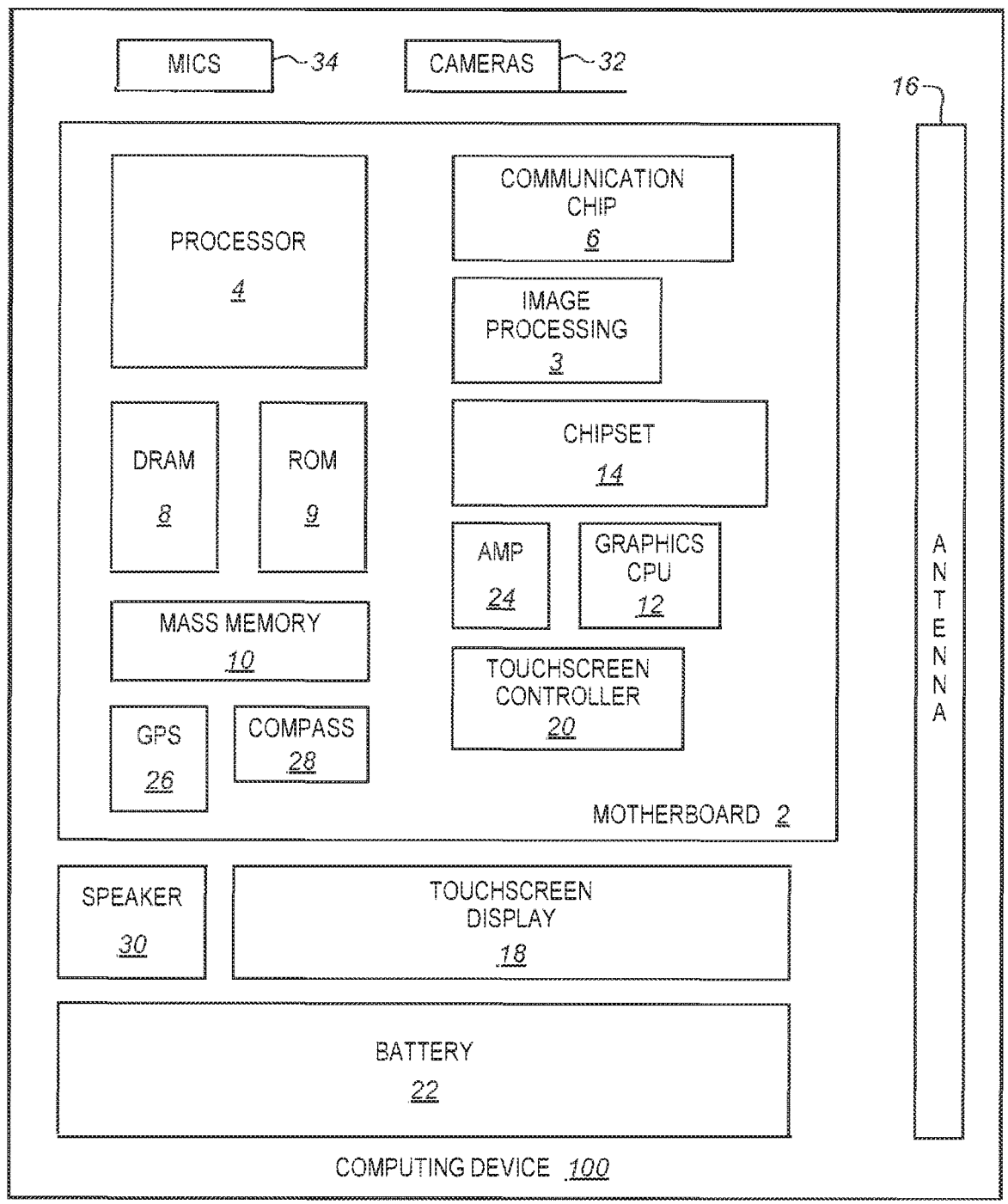
FIG. 16 is a block diagram of a computing device incorporating a memory system or capable of accessing a memory system according to an embodiment.

FIG. 16 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The computing system may be configured to be used as the system module. The computing system also reflects the entire rack-mount memory system where the mass memory is formed from multiple memory cards, as described. The memory system may have multiple iterations of the computing system within a single enclosure for each system module and also for the overall system.

In various implementations, the computing device 100 may be an entertainment front end unit or server, a music or video editing station or back end, a cloud services system, a database, or any other type of high performance or high density storage or computing system.

Embodiments may include one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes in one example a horizontal plane board having a plurality of memory connectors aligned in a row and a plurality of external interfaces, a plurality of memory cards, each having an edge connector at one end of the memory card to connect to a respective memory connector of the board, each memory card extending horizontally parallel to each other memory card and extending vertically and orthogonally from the board, and a plurality of interface connectors each to connect an edge connector to a respective board connector, the interface connectors extending horizontally from the one end of the memory cards and vertically to the respective plane board connector.

In further embodiments the interface connector comprises a printed circuit board and the printed circuit board is vertically aligned with the memory card to allow airflow between the parallel memory cards and between the vertically aligned interface connectors.

In further embodiments the interface connectors are parallel to each other and extending vertically from the plane board.

In further embodiments each memory connector comprises pads on the plane board and wherein each interface connector is soldered to the respective pads on the plane board.

In further embodiments each memory connector comprises sockets and wherein each interface connector is inserted into the respective socket.

In further embodiments each interface connector comprises a socket and each memory card edge connector is inserted into the respective interface connector socket.

In further embodiments the sockets further comprise a bus bar that extends through the sockets to provide a common power supply to multiple memory cards.

In further embodiments each socket comprises a ledge to support the bus bar in one direction and a stop at one end of the ledge to prevent movement of the bus bar in a second orthogonal direction.

In further embodiments the memory card edge connector comprises a slot into which the bus bar is placed when the edge connector is inserted into a socket, wherein the slot is defined, in part, by a finger which engages the bus bar on one side.

Further embodiments include a second bus bar that extends through the sockets, wherein the memory card edge connector comprises a second finger to engage the second bus bar on a side opposite the side on which the first finger engages the first bus bar.

In further embodiments the interface connector socket comprises a guide to receive the finger, the guide including a stop so that a memory card is limited in horizontal movement into the connector by the finger being pushed against the stop.

Further embodiments include an enclosure configured to mount in a rack, the enclosure having a front configured to receive airflow and a rear configured for cabling, wherein the horizontal plane board is mounted inside the enclosure having a first side and a second opposite side, the first side being attached to the memory cards, wherein the memory cards extend from the from the front of the enclosure to attach to the horizontal plane board, a power supply proximate the rear of the enclosure and the first side of the horizontal plane board to provide power to the memory cards through the memory card connectors and having a fan to pull air from the front of the enclosure between the memory cards and to push air out the rear of the enclosure, and a cabling interface at the rear of the enclosure coupled to the external connectors.

In further embodiments the memory cards each comprise a plurality of memory chips and a memory controller chip coupled to each of the memory chips and to the connector.

Some embodiments pertain to a memory card connector that includes a first multiple contact connector having a plurality of pins configured to be attached to a horizontal plane board so that the memory card connector extends orthogonal to the plane board, a plurality of legs extending from the memory card connector configured to rest against the horizontal surface of the plane board to stabilize the position of the memory card connector, and a second multiple contact connector having a socket configured to receive an edge connector of a memory card so that the memory card extends vertically and orthogonally from the plane board and away from the edge of the memory card and the connector across a top surface of the plane board.

In further embodiments the memory card connector is configured to be attached to the plane board aligned in a row to connect to parallel memory cards across the row and is further configured to allow airflow between the parallel memory cards and between the vertically aligned memory card connectors.

In further embodiments the first connector is orthogonal to the second connector.

Further embodiments include a printed circuit board between the first connector and the second connector having quarter-circle wiring layers to connect the first connector to the second connector.

Some embodiments pertain to an apparatus that includes an enclosure configured to mount in a rack, the enclosure having a front configured to receive airflow and a rear configured for cabling, a horizontal plane board in the enclosure having a plurality of memory connectors and a plurality of external interfaces, the horizontal plane board having a first side and a second opposite side, a plurality of memory cards, each having an edge connector on a vertical edge at one end of the respective memory card to connect through a respective quarter-circle connector to the horizontal plane board, each memory card extending parallel to each other memory card from the front of the enclosure and extending orthogonally from the first side of the horizontal plane board, a power supply proximate the rear of the enclosure and the first side of the horizontal plane board to provide power to the memory cards through the quarter-circle connectors and having a fan to pull air from the front of the enclosure between the memory cards and to push air out the rear of the enclosure, and a cabling interface at the rear of the enclosure coupled to the external connectors, wherein the quarter-circle connectors each have a first connection interface to connect to a respective memory card edge connector and a second connection interface to connect to a respective board connector of the plane board, the quarter-circle connectors extending from the vertical edge of the respective memory card horizontally and vertically to the respective plane board connector, so that the first connector is orthogonal to the second connector.

In further embodiments the quarter-circle connector comprises a printed circuit board and the printed circuit board is vertically aligned with the memory card to allow airflow between the parallel memory cards and between the vertically aligned quarter-circle connectors.

In further embodiments the first connector of each quarter-circle connector comprises a socket and each memory card edge is inserted into the respective first connector socket.

The invention claimed is:

1. An apparatus comprising:
   a printed circuit board (PCB);
   a plurality of connectors aligned in a row and mounted on the PCB, each of the plurality of connectors including a slot extending orthogonally from the PCB, the slot including electrical contacts; and
   a plurality of solid state drive (SSD) cards, each of the plurality of SSD cards having a connector at one end of the SSD card to be received by the slot of one of the plurality of connectors mounted on the PCB;
   wherein the slot of each of the plurality of connectors is to receive the connector of one of the plurality of the SSD cards in a direction parallel to the PCB, each of the plurality of SSD cards to extend parallel to one another and to extend vertically from the PCB.

2. The apparatus of claim 1, further comprising:
   a chassis, wherein the PCB is mounted in the chassis.

3. The apparatus of claim 2, further comprising:
   a plurality of fans in the chassis to pull air from a front of the chassis to a rear of the chassis.

4. The apparatus of claim 3, wherein:
   the plurality of fans are mounted between the plurality of SSD cards and a rear of the chassis.

5. The apparatus of claim 2, wherein:
   the chassis includes a bottom plate to hold the plurality of SSD cards parallel to one another.

6. The apparatus of claim 2, wherein:
   the chassis includes a 1 U height rack chassis.

7. The apparatus of claim 1, wherein:
   one or more of the plurality of SSD cards include a printed circuit board (PCB) and memory chips mounted on the PCB of the SSD card.

8. The apparatus of claim 7, wherein:
   the memory chips include one or more of: 3D NAND flash memory, PCM (Phase Change Memory), STTM (Spin Transfer Torque Memory), magnetic memory, and polymer memory.

9. The apparatus of claim 7, further comprising:
   a memory controller mounted on the PCB of the SSD card.

10. The apparatus of claim 1, wherein:
    each of the plurality of SSD cards includes a first edge, a second edge that is shorter than the first edge, and a thickness that is less than a length of the second edge, the first edge to extend parallel to the PCB and the second edge to extend orthogonally from the PCB.

11. The apparatus of claim 1, wherein:
    the plurality of SSD cards includes 32 SSD cards.

12. A system comprising:
    a rack-mount chassis having a 1 U height;
    a printed circuit board (PCB) in the rack-mount chassis;
    a plurality of connectors aligned in a row and mounted on the PCB, each of the plurality of connectors including a slot extending orthogonally from the PCB, the slot including electrical contacts; and
    a plurality of solid state drives (SSDs), each of the plurality of SSDs having a connector at one end of the SSD to be received by the slot of one of the plurality of connectors mounted on the PCB;
    wherein the slot of each of the plurality of connectors is to receive the connector of one of the plurality of the SSDs in a direction parallel to the PCB, each of the plurality of SSDs to extend parallel to one another and to extend vertically from the PCB.

13. The system of claim 12, further comprising:
    one or more processors.

14. The system of claim 12, wherein:
    one or more of the plurality of SSDs include a printed circuit board (PCB) and memory chips mounted on the PCB of the SSD.

15. The system of claim 14, wherein:
    the memory chips include one or more of: 3D NAND flash memory, PCM (Phase Change Memory), STTM (Spin Transfer Torque Memory), magnetic memory, and polymer memory.

16. The system of claim 14, further including:
    a memory controller mounted on the PCB of the SSD.

17. The system of claim 12, wherein:
    each of the plurality of SSDs includes a first edge, a second edge that is shorter than the first edge, and a thickness that is less than a length of the second edge, the first edge to extend parallel to the PCB and the second edge to extend orthogonally from the PCB.

18. The system of claim 12, further comprising:
    a plurality of fans in the chassis to pull air from a front of the rack-mount chassis to a rear of the chassis.

19. The system of claim 18, wherein:
    the plurality of fans are mounted between the plurality of SSDs and a rear of the rack-mount chassis.

20. The system of claim 12, wherein:
    the rack-mount chassis includes a bottom plate to hold the plurality of SSDs parallel to one another.

21. The system of claim 12, wherein:
    the plurality of SSDs includes 32 SSDs.

* * * * *